(12) United States Patent
Kawamoto

(10) Patent No.: US 6,407,413 B1
(45) Date of Patent: Jun. 18, 2002

(54) SEMICONDUCTOR DEVICE WITH GUARD RING AND ZENER DIODE LAYER THEREOVER

(75) Inventor: Atsunobu Kawamoto, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/609,667

(22) Filed: Jul. 3, 2000

(30) Foreign Application Priority Data

Feb. 1, 2000 (JP) ........................................ 2000-023753

(51) Int. Cl.[7] .............................................. H01L 29/74
(52) U.S. Cl. ...................................................... 257/133
(58) Field of Search ................................ 257/133, 139, 257/140, 146, 168, 170, 173, 495, 551, 603, 605

(56) References Cited

U.S. PATENT DOCUMENTS 5,475,258 A * 12/1995 Kato et al.

FOREIGN PATENT DOCUMENTS

JP 9-186315 7/1997

* cited by examiner

*Primary Examiner*—Keith Christianson
(74) *Attorney, Agent, or Firm*—Oblon, Spivak, McClelland, Maier & Neustadt, P.C.

(57) ABSTRACT

A semiconductor device includes a polysilicon diode layer formed so that pn junctions are positioned only in a portion (first portion) of the polysilicon diode layer which overlies at least one guard ring having a field alleviating structure for holding the breakdown voltage of an IGBT, thereby to prevent the deterioration of the breakdown voltage of the polysilicon diode resulting from the operation of a MOSFET including the pn junctions of the polysilicon diode layer between the collector and gate of the IGBT, an n⁻ drift layer and a field oxide film.

5 Claims, 5 Drawing Sheets

SEMICONDUCTOR DEVICE WITH GUARD RING AND ZENER DIODE LAYER THEREOVER

BACKGROUND OF THE INVENTION

1. Field of the Invention

The present invention relates to a semiconductor device including a Zener diode layer of the type having Zener diodes connected in series opposition between the collector and gate of an insulated gate bipolar transistor (referred to hereinafter as an IGBT).

2. Description of the Background Art

A prior art technique in which a Zener diode layer including alternately repeatedly arranged n and p layers is provided between the collector and gate of an IGBT is disclosed in, for example, Japanese Patent Application Laid-Open No. 9-186315 (1997). FIG. 6A shows a vertical cross-sectional structure of a semiconductor device which employs such a prior art technique.

In FIG. 6A, the reference numeral 1 designates an emitter electrode; 2 designates a gate electrode; 3 designates a collector electrode for a polysilicon diode layer; 4 designates a collector electrode connected to the collector electrode 3; 5 designates a gate electrode layer connected to the gate electrode 2; 6 designates a gate insulation film; 7 designates n source regions; 8 designates p wells; 9 designates guard rings; 10 designates an n type semiconductor layer; 11 designates an n⁻ drift layer; 12 designates an n⁺ buffer layer; 13 designates a collector layer; 14 designates an insulation film; 15 designates a field oxide film; 16 designates a polysilicon diode layer (a Zener diode layer); 17 designates an n⁺ layer; and 20 designates a semiconductor substrate.

In the prior art technique, a structure for holding the breakdown voltage of the IGBT comprises (1) the polysilicon diode layer 16 including Zener diodes connected in series opposition one after another, and (2) the guard rings 9.

In the prior art IGBT structure illustrated in FIG. 6A, adjacent pn junctions in the polysilicon diode layer 16, the n⁻ layer 11 including the guard rings 9 and the field oxide film 15 constitute a local n channel MOSFET. In this case, an n layer closer to the gate electrode 2 serves as a source layer of the MOSFET, an n layer closer to the collector electrode 3 serves as a drain layer thereof, and one of the guard rings 9 which underlies a centrally positioned p layer or part of the n⁻ layer 11 around the one guard ring 9 serves as a gate electrode layer thereof. The presence of such a local n channel MOSFET on the n type semiconductor layer 10 results in a potential distribution in the n⁻ layer 11 as schematically illustrated in FIG. 6B, for example, when a voltage of 500 V is applied between the gate 2 (5) and the collector 3 (4). It will be apparent from FIG. 6B that there is a large potential difference between adjacent ones of the guard rings 9. Also, there is a relatively large potential difference in part of the n⁻ layer 11 which lies inside the innermost (or leftmost in FIG. 6A) guard ring 9 and in part of the n⁻ layer 11 which lies outside the outermost (or rightmost in FIG. 6A) guard ring 9. Such potential differences act as an applied voltage VGS to be impressed between the gate and source of the n channel MOSFET. If the applied voltage VGS exceeds the inversion voltage Vth of the n channel MOSFET itself, the n channel MOSFET is inverted and placed into an operating state. This causes a current ID to flow through the npn portion in the polysilicon diode layer 16, resulting in change in and deterioration of the breakdown voltage of the polysilicon diode layer 16.

Such a problem is not peculiar to the polysilicon diode layer 16 having the structure illustrated in FIG. 6A, but arises in general when a guard ring is formed in a semiconductor substrate and a Zener diode layer having a plurality of pn junctions formed by alternately repeatedly arranging p and n layers between a pair of n layers on the opposite ends is formed on a field insulation film formed on the semiconductor substrate.

SUMMARY OF THE INVENTION

According to a first aspect of the present invention, a semiconductor device comprises: a semiconductor substrate comprising a first semiconductor layer of a first conductivity type, and a second semiconductor layer of a second conductivity type formed on the first semiconductor layer; at least one guard ring extending from a surface of the second semiconductor layer inwardly of the second semiconductor layer and provided in the form of a well of an impurity of the first conductivity type; a field insulation film formed on a first region included in the surface of the second semiconductor layer and containing a surface of the at least one guard ring; and a Zener diode layer formed on a second region included in a surface of the field insulation film and containing a portion positioned over the surface of the at least one guard ring, the Zener diode layer having a plurality of pn junctions formed by alternately repeatedly arranging p and n layers, wherein the pn junctions are formed only in a first portion of the Zener diode layer which is positioned over the surface of the at least one guard ring.

Preferably, according to a second aspect of the present invention, in the semiconductor device of the first aspect, the Zener diode layer includes a second portion adjacent to the first portion, and the pn junctions are not formed in the second portion.

According to a third aspect of the present invention, a semiconductor device comprises: a semiconductor substrate comprising a first semiconductor layer of a first conductivity type, and a second semiconductor layer of a second conductivity type formed on the first semiconductor layer; at least one guard ring extending from a surface of the second semiconductor layer inwardly of the second semiconductor layer and provided in the form of a well of an impurity of the first conductivity type; a field insulation film formed on a first region included in the surface of the second semiconductor layer and containing a surface of the at least one guard ring; and a Zener diode layer formed on a second region included in a surface of the field insulation film and containing a portion positioned over the surface of the at least one guard ring, the Zener diode layer having a plurality of pn junctions formed by alternately repeatedly arranging p and n layers, the Zener diode layer including a first portion positioned over the surface of the at least one guard ring, and a second portion adjacent to the first portion, wherein ones of the plurality of pn junctions are always formed in the second portion of the Zener diode layer, and wherein a MOSFET including adjacent ones of the plurality of pn junctions of the Zener diode layer, the second semiconductor layer including the at least one guard ring, and the field insulation film has an inversion voltage greater than an applied voltage to the MOSFET.

Preferably, according to a fourth aspect of the present invention, in the semiconductor device of the third aspect, the field insulation film has a thickness adjusted to make the inversion voltage greater than the applied voltage.

Preferably, according to a fifth aspect of the present invention, in the semiconductor device of the third aspect, each of the pn junctions constituting the MOSFET has a breakdown voltage adjusted to make the inversion voltage greater than the applied voltage.

In accordance with the first to fifth aspects of the present invention, when the Zener diode layer is provided between the collector and gate of an IGBT, the MOSFET including the second semiconductor layer including the at least one guard ring, adjacent ones of the plurality of pn junctions of the Zener diode layer, and the field insulation film does not operate. Therefore, the semiconductor device of the first to fifth aspects of the present invention effectively prevents a change in breakdown voltage of the Zener diode layer to provide improved reliability.

In particular, the third to fifth aspects of the present invention have the advantage of allowing the direct use of a conventional process for forming a Zener diode layer as a process for forming the Zener diode layer of the present invention.

It is therefore an object of the present invention to provide a structure of a Zener diode layer which does not cause a change in breakdown voltage, and an IGBT structure having such a Zener diode layer.

These and other objects, features, aspects and advantages of the present invention will become more apparent from the following detailed description of the present invention when taken in conjunction with the accompanying drawings.

DESCRIPTION OF THE PREFERRED EMBODIMENTS

First Preferred Embodiment

A feature of a first preferred embodiment of the present invention is such that a pn junction is formed only in a portion (referred to hereinafter as a first portion) of a Zener diode layer which is positioned over the surface of each guard ring, but no pn junction is formed in a portion (or a second portion adjacent to the first portion) of the Zener diode layer which is positioned over a semiconductor substrate portion lying between adjacent guard rings. A semiconductor device according to the first preferred embodiment of the present invention will now be described with reference to the drawings.

Figure 1:
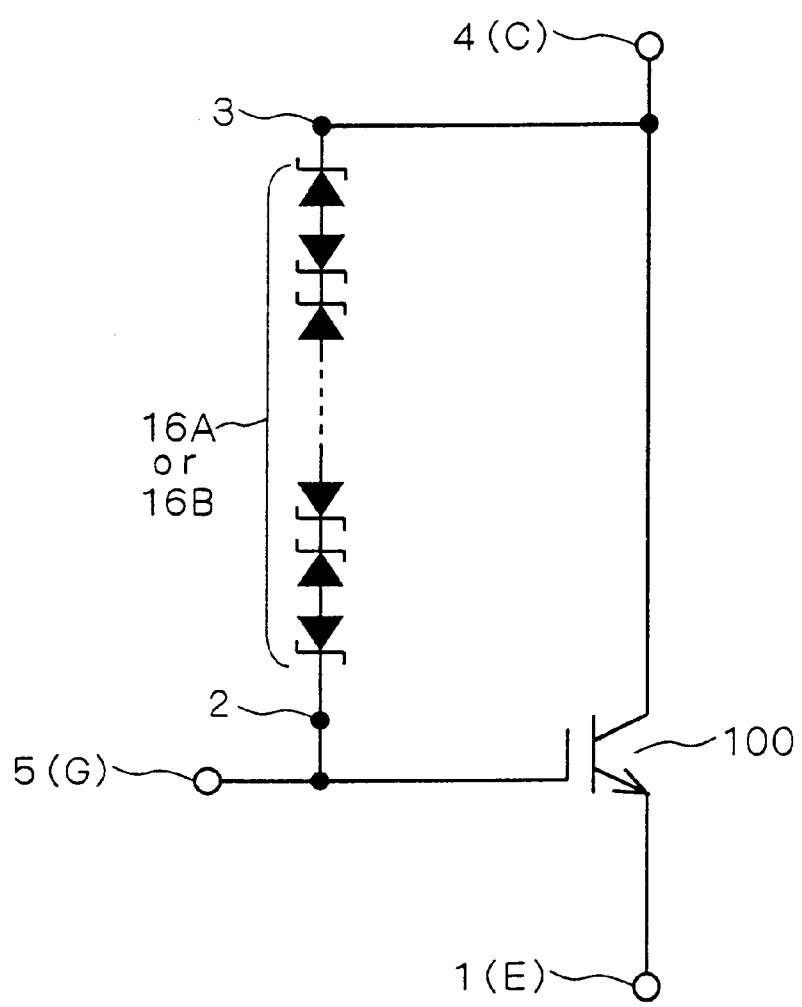
FIG. 1 shows an equivalent circuit of a semiconductor device according to first and second preferred embodiments of the present invention.
Figure 2:
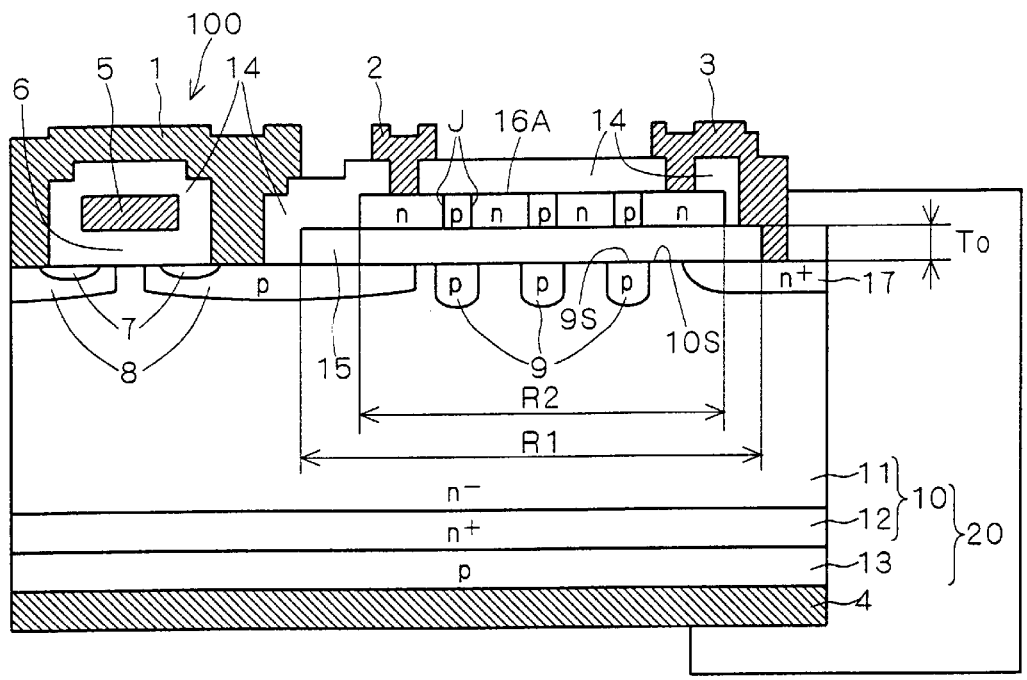
FIGS. 2 and 3 are vertical cross-sectional views of structures of the semiconductor device according to the first preferred embodiment.

FIG. 1 is a common figure to the first preferred embodiment and a second preferred embodiment to be described later according to the present invention, and is an equivalent circuit diagram of the semiconductor device. As shown in FIG. 1, the semiconductor device broadly comprises an IGBT element 100 in an IGBT cell portion, and a Zener diode 16A (which is designated by the reference character 16B in the second preferred embodiment) connected between a collector electrode 4 and a gate electrode layer 5 of the element 100. The Zener diode 16A is defined as a Zener diode layer 16A in FIG. 2 to be described later. The Zener diode 16A has a structure such that Zener diode elements are connected in series opposition. This structure is formed by alternately repeatedly arranging p and n layers between a pair of n layers on the opposite ends, as shown in FIG. 2. The IGBT element 100 and the Zener diode 16A (16B) of FIG. 1 are integrated on the same semiconductor substrate, which will be illustrated in FIG. 2.

With reference to FIG. 2, a semiconductor substrate 20 which is a silicon wafer or the like comprises a p type (first conductivity type) collector layer or first semiconductor layer 13, and an n type (second conductivity type) second semiconductor layer 10 formed on the entire surface of the layer 13. The second semiconductor layer 10 includes an $n^+$ buffer layer 12 formed on the surface of the collector layer 13, and an $n^-$ drift layer (referred to simply as an "$n^-$ layer" hereinafter) 11 formed on the surface of the $n^+$ buffer layer 12. The collector electrode or first main electrode 4 of the IGBT element 100 is formed on an entire first main surface of the semiconductor substrate 20. A pair of p wells 8 opposed to each other with a portion of the $n^-$ layer 11 which serves as a channel portion of the IGBT element 100 therebetween and extending from a second main surface of the semiconductor substrate 20 or the surface of the $n^-$ layer 11 inwardly of the $n^-$ layer 11 are formed in the IGBT cell portion of the semiconductor substrate 20 or the $n^-$ layer 11. An n source layer 7 extends from the surface of each of the p wells 8 inwardly thereof. A gate insulation film 6 is formed on the portion of the $n^-$ layer 11 which lies between the p wells 8 and serves as the channel portion, on portions of the p wells 8 which lie between the channel portion and the respective n source layers 7, and on portions of the surface of the respective n source layers 7. The gate electrode layer 5 is formed on the gate insulation film 6, and an insulation film 14 is formed to cover the entire upper and side surfaces of the gate electrode layer 5. An emitter electrode 1 is formed on the remaining portion of the surface of the n source layers 7 and on a portion of the surface of the p wells 8 to entirely cover the insulation film 14. These components constitute the IGBT element 100.

On the other hand, a portion for holding the breakdown voltage of the IGBT element 100 which is positioned outside the IGBT cell portion has a structure to be described below. A plurality of guard rings 9, herein three, are formed in a portion of the $n^-$ layer 11 which lies between an end of one of the p wells 8 in the $n^-$ layer 11 and an end of an $n^+$ layer 17 extending from the surface 10S of the second semiconductor layer 10 inwardly of the $n^-$ layer 11. The guard rings 9 are known components for alleviating an electric field to hold the breakdown voltage of the IGBT element 100, and each extend from the surface 10S inwardly of the $n^-$ layer 11 in the form of a ring-shaped well of a p type (first conductivity type) impurity (or p well). The guard rings 9 are spaced at an approximately equal pitch. A field oxide film or field insulation film 15 is formed on a first region R1 included in the surface 10S and containing the surfaces 9S of the respective three guard rings 9. The Zener diode layer 16A described with reference to FIG. 1 is formed on a second region R2 (R2<R1) included in the surface of the film 15 and containing portions overlying the surfaces 9S of the respective three guard rings 9. The layer 16A is made of, for example, polysilicon as a base material (but of course may be made of other materials), and is formed by repeating a pn structure three times, starting with the n layer connected to the gate electrode 2 (the leftmost n layer in FIG. 2). Thus, the layer 16A has six pn junctions J. Between the n layer connected to the gate electrode 2 and the n layer connected to the electrode 3 to be described later (both of which are approximately equal in width as measured in the direction in which the guard rings 9 are arranged) are disposed p and n layers having respective widths, as measured in the direction in which the guard rings 9 are arranged, which satisfy the relationship: (p layer width)<(n layer width). Additionally, the p layer width is less than the width of the surface 9S as measured in the direction in which the guard rings 9 are arranged, and the n layer width is greater than the spacing between the guard rings. The gate electrode 2 is connected to the gate electrode layer 5 through an interconnect layer not shown. The Zener diode layer 16A is referred to as the polysilicon diode layer 16A hereinafter. A collector electrode 3 for the polysilicon diode layer is formed on the surface of the rightmost n layer in the polysilicon diode layer 16A. The electrode 3 is also connected to the collector electrode 4. The insulation film 14 is formed on the surface of the polysilicon diode layer 16A between the electrodes 2 and 3. The insulation film 14 is also formed between the side surfaces of the components 15, 16A, 2 and the confronting side surface of the emitter electrode 1. In the first preferred embodiment, the thickness of the field oxide film 15 is equal to the prior art thickness $T_0$ thereof shown in FIG. 6A.

In the above described structure of the first preferred embodiment, the p and n layers in the polysilicon diode layer 16A are sized and arranged so that the pn junctions J are positioned only in the first portions of the polysilicon diode layer 16A which overlie the surfaces 9S of the respective guard rings 9 but no pn junction is positioned in the second portions (on the opposite sides of each of the first portions) of the polysilicon diode layer 16A which overlie portions of the n⁻ layer 11 between adjacent ones of the guard rings 9, between the guard rings 9 and the p wells 8 and between the guard rings 9 and the n⁺ layer 17.

Figures 6A, 6B:
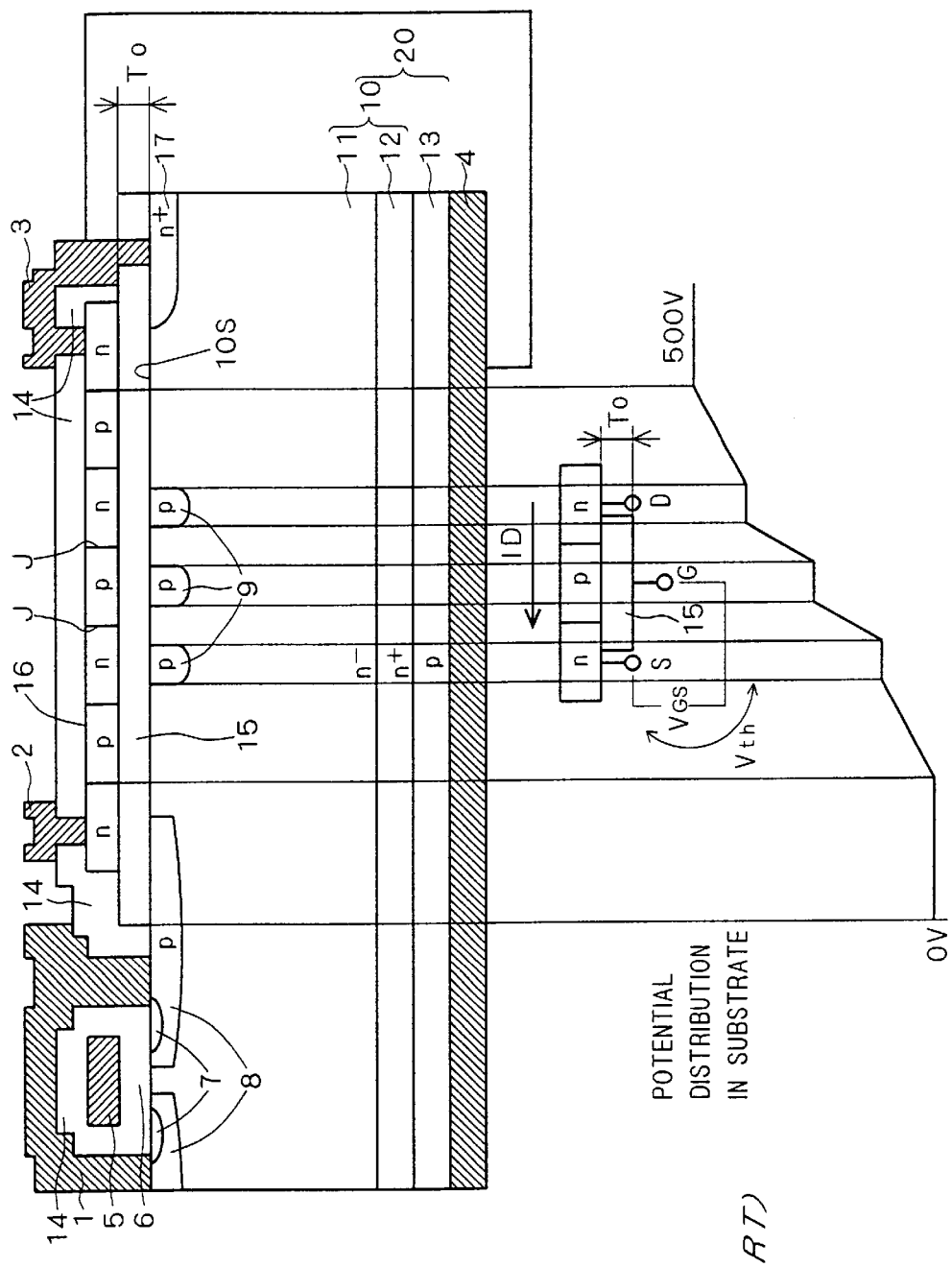
FIG. 6A is a vertical cross-sectional view of a structure of a prior art semiconductor device.
FIG. 6B illustrates a problem with the prior art semiconductor device.

The above described structure of the polysilicon diode layer 16A completely eliminates the generation of the local n channel MOSFET on the n⁻ layer 11 which has been formed in the prior art structure shown in FIG. 6A. This provides the IGBT in which the polysilicon diode layer 16A between the collector and gate of the IGBT element 100 has an unchanged breakdown voltage.

Although the polysilicon diode layer 16A includes the three repeatedly arranged pn structures in the first preferred embodiment as shown in FIG. 2, the number of pn structures repeatedly arranged is not limited to three but may be greater than three.

Figure 3:
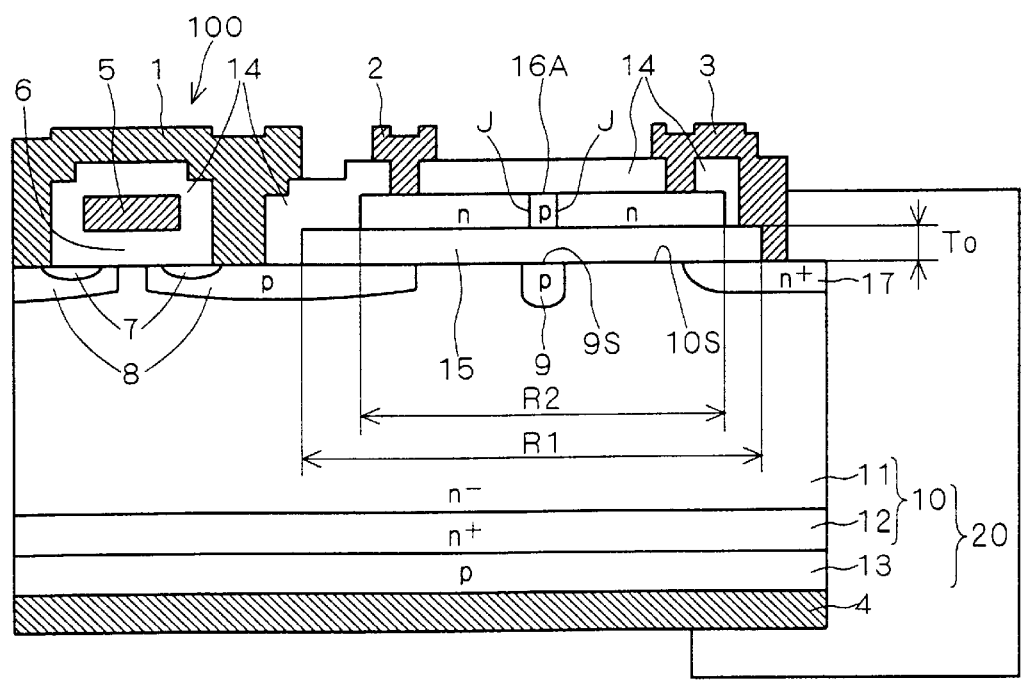

With reference to FIG. 3, when an npn structure is used to form the polysilicon diode layer 16A (in which case the number of pn junctions J is two), the single guard ring 9 is formed in the n⁻ layer 11, and two pn junctions J are positioned in the first portion of the polysilicon diode layer 16A which lies over the surface 9S of the guard ring 9.

It will be apparent from the above description that the number of guard rings includes, but not limited to, three in the structure of FIG. 2, and at least one guard ring 9 is required to be formed in the n⁻ layer 11.

Second Preferred Embodiment

The semiconductor device according to a second preferred embodiment features an improvement on the prior art structure of the Zener diode layer illustrated in FIG. 6A while basically following the prior art structure. More specifically, when the polysilicon diode layer is formed so that the pn junctions are always positioned in the second portion (adjacent to the first portion) of the polysilicon diode layer which overlies a portion of the n⁻ layer between the guard rings, the local n channel MOSFET comprising adjacent ones of the pn junctions in the polysilicon diode layer, the field oxide film, and part of the n⁻ layer including a single guard ring and opposed to the adjacent pn junctions with the field oxide film therebetween has an inversion voltage margin increased over the prior art margin. In other words, the semiconductor device is constructed so that the condition: (inversion voltage Vth)>(applied voltage VGS) is always fulfilled.

Figure 4:
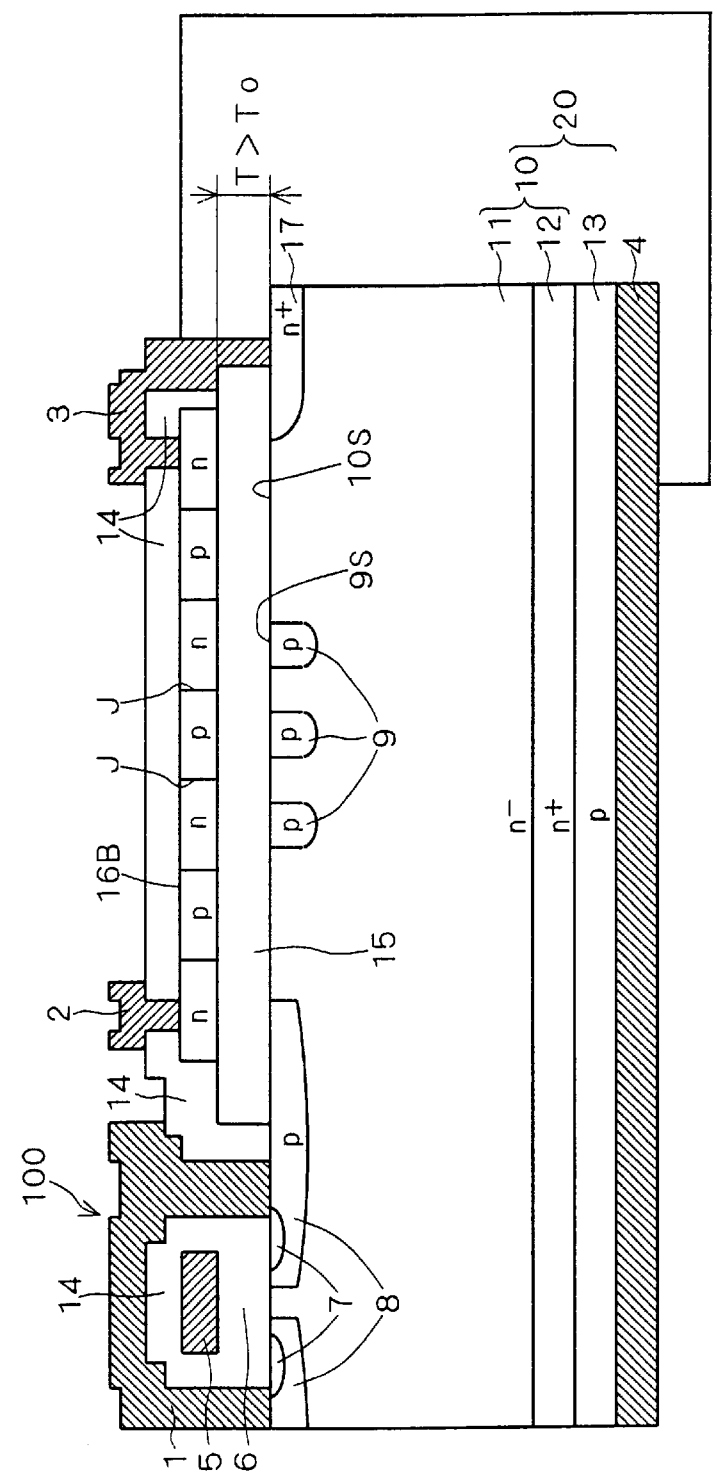
FIGS. 4 and 5 are vertical cross-sectional views of structures of the semiconductor device according to the second preferred embodiment.

A structure of the semiconductor device for fulfilling the above condition is shown in FIG. 4, for example, in which the thickness T of the field oxide film 15 under the polysilicon diode layer 16B is greater than the thickness $T_0$ of the film 15 of FIGS. 2 and 6A (T>$T_0$). For instance, when the thickness $T_0$ of the field oxide film 15 in the prior art structure is about 1 $\mu$m, it is contemplated that the thickness T of the field oxide film 15 of FIG. 4 adjusted to not less than about 1.5 $\mu$m increases the inversion voltage Vth to fulfill the condition: (inversion voltage Vth)>(applied voltage VGS). In summary, the requirement is to adjust the thickness T so as to satisfy the condition: (inversion voltage Vth)>(applied voltage VGS).

FIG. 4 shows an example of the structure, similar to that of FIG. 2, which comprises the three guard rings 9, and the polysilicon diode layer 16B formed by repeating the pn structure three times, starting with the n layer connected to the gate electrode 2. In FIG. 4, like reference characters designate components identical with those of FIG. 2. In the second preferred embodiment, of course, only at least one guard ring 9 and only at least two pn junctions of the polysilicon diode layer 16B are required.

Figure 5:
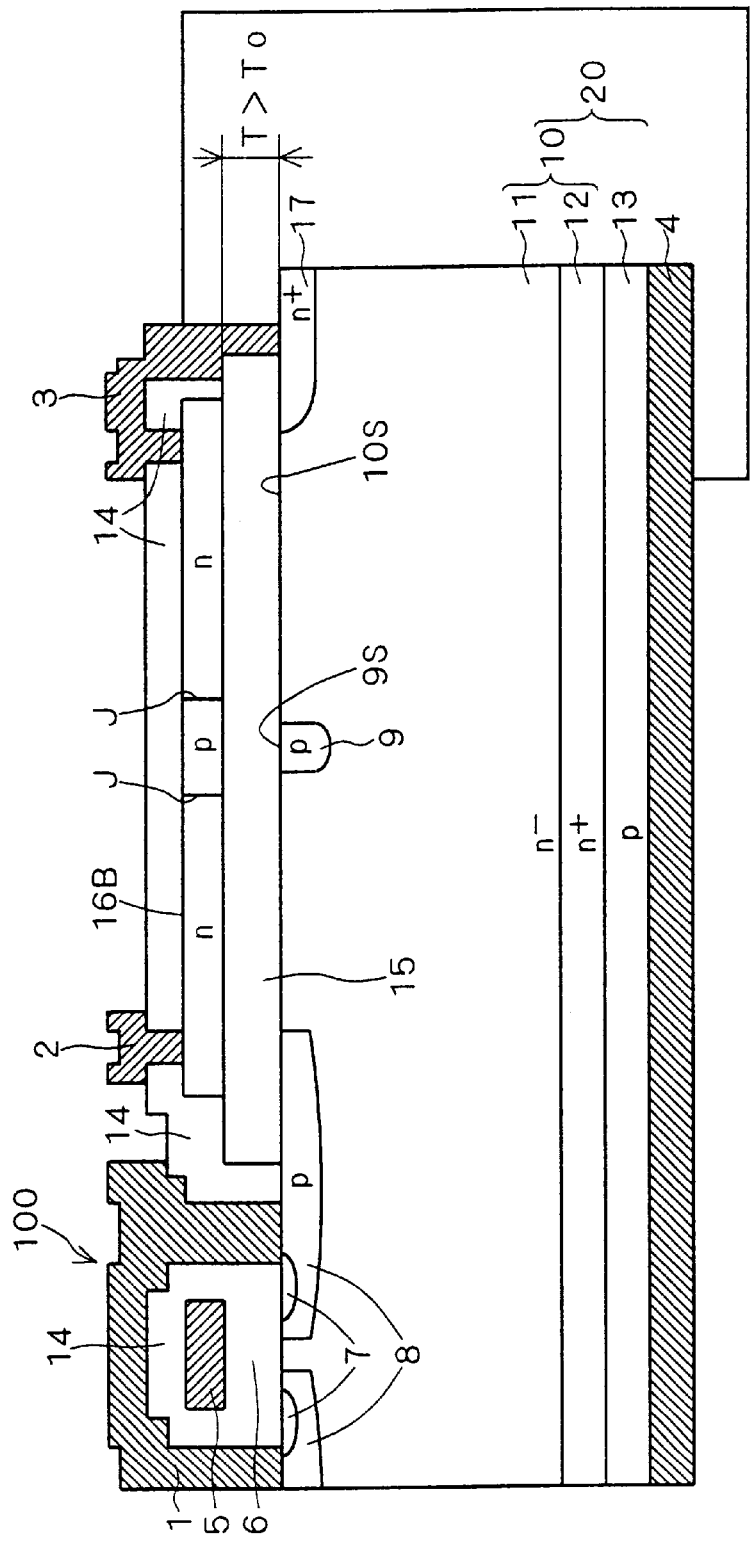

FIG. 5 is a vertical cross-sectional view of an example of the structure of the semiconductor device which comprises two pn junctions in the polysilicon diode layer 16B and one guard ring according to the second preferred embodiment. The structure of FIG. 5 also satisfies the conditions: (thickness T)>(thickness $T_0$), and (inversion voltage Vth)>(applied voltage VGS).

Another structure which can satisfy the condition: (inversion voltage Vth)>(applied voltage VGS) is designed to reduce the breakdown voltage per pn junction of the npn structure of the polysilicon diode layer constituting the above-mentioned n channel MOSFET. Such a structure apparently reduces the applied voltage VGS relative to the inversion voltage Vth to provide an IGBT which suppresses the operation of the n channel MOSFET to eliminate a change in breakdown voltage of the polysilicon diode layer 16 (FIG. 6A). For instance, assuming that the polysilicon diode layer 16 constituting the n channel MOSFET in the prior art structure has a breakdown voltage of 10 V to 12 V per pn junction, the condition: (inversion voltage Vth)>(applied voltage VGS) is satisfied by reducing the breakdown voltage per pn junction to about 8 V. In summary, the requirement is to adjust the breakdown voltage per pn junction so as to satisfy the condition: (inversion voltage Vth)>(applied voltage VGS). The polysilicon diode layer including the pn junction having such a breakdown voltage is practicable by known manufacturing methods.

Modifications

Although the n channel IGBT is used as the IGBT element 100 of the first and second preferred embodiments, the present invention is also applicable to a p channel IGBT for use as the IGBT element 100 in place of the n channel IGBT.

For the p channel IGBT, the n type corresponds to the "first conductivity type," the p type to the "second conductivity type," an n collector layer to the "first semiconductor layer," a p+ buffer layer and a p− drift layer to the "second semiconductor layer," the emitter electrode to the "first main electrode," and the collector electrode to the "second main electrode," and the guard ring is a well of an n type impurity.

The central portion of the first portion of the polysilicon diode layer 16A over the guard ring surface 9S in the first preferred embodiment includes, but not limited to, the p layer, and may include an n layer instead.

While the invention has been described in detail, the foregoing description is in all aspects illustrative and not restrictive. It is understood that numerous other modifications and variations can be devised without departing from the scope of the invention.

What is claimed is:

1. A semiconductor device comprising:

a semiconductor substrate comprising a first semiconductor layer of a first conductivity type, and a second semiconductor layer of a second conductivity type formed on said first semiconductor layer;

at least one guard ring extending from a surface of said second semiconductor layer inwardly of said second semiconductor layer and provided in the form of a well of an impurity of said first conductivity type;

a field insulation film formed on a first region included in said surface of said second semiconductor layer and containing a surface of said at least one guard ring; and a Zener diode layer formed on a second region included in a surface of said field insulation film and containing a portion positioned over said surface of said at least one guard ring, said Zener diode layer having a plurality of pn junctions formed by alternately repeatedly arranging p and n layers, wherein said pn junctions are formed only in a first portion of said Zener diode layer which is positioned over said surface of said at least one guard ring.

2. The semiconductor device according to claim 1, wherein said Zener diode layer includes a second portion adjacent to said first portion, and said pn junctions are not formed in said second portion.

3. A semiconductor device comprising:

a semiconductor substrate comprising a first semiconductor layer of a first conductivity type, and a second semiconductor layer of a second conductivity type formed on said first semiconductor layer;

at least one guard ring extending from a surface of said second semiconductor layer inwardly of said second semiconductor layer and provided in the form of a well of an impurity of said first conductivity type;

a field insulation film formed on a first region included in said surface of said second semiconductor layer and containing a surface of said at least one guard ring; and a Zener diode layer formed on a second region included in a surface of said field insulation film and containing a first portion positioned over said surface of said at least one guard ring and a second portion formed adjacent to said first portion without being over said surface of said at least one guard ring, said Zener diode layer having a plurality of pn junctions formed by alternately repeatedly arranging p and n layers, wherein at least one of said plurality of pn junctions is formed in said second portion of said Zener diode layer, and wherein a MOSFET including adjacent ones of said plurality of pn junctions of said Zener diode layer, said second semiconductor layer including said at least one guard ring, and said field insulation film has an inversion voltage greater than an applied voltage to said MOSFET.

4. The semiconductor device according to claim 3, wherein said field insulation film has a thickness adjusted to make said inversion voltage greater than said applied voltage.

5. The semiconductor device according to claim 3, wherein each of said pn junctions constituting said MOSFET has a breakdown voltage adjusted to make said inversion voltage greater than said applied voltage.

* * * * *